(12) United States Patent
Kido et al.

(10) Patent No.: US 10,453,693 B2
(45) Date of Patent: Oct. 22, 2019

(54) SURFACE MACHINING METHOD FOR SINGLE CRYSTAL SIC SUBSTRATE, MANUFACTURING METHOD THEREOF, AND GRINDING PLATE FOR SURFACE MACHINING SINGLE CRYSTAL SIC SUBSTRATE

(71) Applicant: SHOWA DENKO K.K., Minato-ku, Tokyo (JP)

(72) Inventors: Takanori Kido, Hikone (JP); Tomohisa Kato, Tsukuba (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/935,320

(22) Filed: Mar. 26, 2018

(65) Prior Publication Data

US 2018/0218916 A1 Aug. 2, 2018

Related U.S. Application Data

(62) Division of application No. 15/448,462, filed on Mar. 2, 2017, now Pat. No. 9,960,048, which is a division
(Continued)

(30) Foreign Application Priority Data

Feb. 13, 2013 (JP) ................. 2013-026081

(51) Int. Cl.
*H01L 21/306* (2006.01)
*H01L 21/321* (2006.01)
(Continued)

(52) U.S. Cl.
CPC ...... *H01L 21/30625* (2013.01); *B24B 37/245* (2013.01); *C30B 29/36* (2013.01);
(Continued)

(58) Field of Classification Search
None
See application file for complete search history.

(56) References Cited

U.S. PATENT DOCUMENTS

| 3,504,457 A | 4/1970 | Jacobsen et al. |
| 4,918,872 A | 4/1990 | Sato et al. |

(Continued)

FOREIGN PATENT DOCUMENTS

| CN | 1958233 A | 5/2007 |
| CN | 101966689 A | 2/2011 |

(Continued)

OTHER PUBLICATIONS

M.R. Oliver (ed.), Chemical-Mechanical Planarization of Semiconductor Materials, Springer-Verlag Berlin Heidelberg, p. 20. (Year: 2004).*

(Continued)

*Primary Examiner* — Jiong-Ping Lu
(74) *Attorney, Agent, or Firm* — Sughrue Mion, PLLC

(57) ABSTRACT

A surface machining method for a single crystal SiC substrate, including: a step of mounting a grinding plate which includes a soft pad and a hard pad sequentially attached onto a base metal having a flat surface, a step of generating an oxidation product by using the grinding plate, and a step of grinding the surface while removing the oxidation product, wherein abrasive grains made of at least one metallic oxide that is softer than single crystal SiC and has a bandgap are fixed to the surface of the hard pad.

8 Claims, 3 Drawing Sheets

Related U.S. Application Data of application No. 14/765,875, filed as application No. PCT/JP2014/053379 on Feb. 13, 2014, now Pat. No. 9,620,374.

(51) Int. Cl.

| | | |
|---|---|---|
| *H01L 21/02* | (2006.01) | |
| *C30B 29/36* | (2006.01) | |
| *C30B 33/00* | (2006.01) | |
| *H01L 29/16* | (2006.01) | |
| *B24B 37/24* | (2012.01) | |

(52) U.S. Cl.
CPC ........ *C30B 33/00* (2013.01); *H01L 21/02013* (2013.01); *H01L 21/02024* (2013.01); *H01L 21/3212* (2013.01); *H01L 29/1608* (2013.01)

(56) References Cited

U.S. PATENT DOCUMENTS

| | | | |
|---|---|---|---|
| 5,152,917 A | 10/1992 | Pieper et al. | |
| 5,257,478 A | 11/1993 | Hyde et al. | |
| 5,639,363 A | 6/1997 | Ohmori et al. | |
| 5,931,724 A | 8/1999 | Perlov et al. | |
| 5,958,794 A | 9/1999 | Bruxvoort et al. | |
| 6,069,080 A | 5/2000 | James | |
| 6,261,958 B1 | 7/2001 | Crevasse et al. | |
| 6,602,117 B1 | 8/2003 | Chopra et al. | |
| 6,835,120 B1 | 12/2004 | Matsui | |
| 9,620,374 B2* | 4/2017 | Kido | C30B 29/36 |
| 2003/0003857 A1* | 1/2003 | Shimagaki | B24B 37/26 451/534 |
| 2006/0280930 A1 | 12/2006 | Shimomura | |
| 2008/0073222 A1 | 3/2008 | Yamauchi et al. | |
| 2011/0081836 A1 | 4/2011 | Schwandner | |
| 2013/0324015 A1 | 12/2013 | Asano et al. | |
| 2014/0051335 A1 | 2/2014 | Morinaga et al. | |
| 2014/0162455 A1 | 6/2014 | Carswell | |
| 2016/0035579 A1 | 2/2016 | Kido | |

FOREIGN PATENT DOCUMENTS

| | | |
|---|---|---|
| CN | 102029573 A | 4/2011 |
| CN | 102107391 A | 6/2011 |
| EP | 0223920 A2 | 6/1987 |
| EP | 1274123 A1 | 1/2003 |
| JP | 359156 U | 6/1991 |
| JP | 6775 A | 1/1994 |
| JP | 0621028 A | 1/1994 |
| JP | 06077185 A | 3/1994 |
| JP | 07130687 A | 5/1995 |
| JP | 1058333 A | 3/1998 |
| JP | 10156724 A | 6/1998 |
| JP | 10321572 A | 12/1998 |
| JP | 11170167 A | 6/1999 |
| JP | 11198045 A | 7/1999 |
| JP | 11235659 A | 8/1999 |
| JP | 2000190235 A | 7/2000 |
| JP | 2000311874 A | 11/2000 |
| JP | 2000354950 A | 12/2000 |
| JP | 2001205555 A | 7/2001 |
| JP | 2003048164 A | 2/2003 |
| JP | 2004193377 A | 7/2004 |
| JP | 2004255467 A | 9/2004 |
| JP | 2005142441 A | 6/2005 |
| JP | 2005277130 A | 10/2005 |
| JP | 2005288552 A | 10/2005 |
| JP | 2006055964 A | 3/2006 |
| JP | 2006198701 A | 8/2006 |
| JP | 2007283410 A | 11/2007 |
| JP | 20086559 A | 1/2008 |
| JP | 200881389 A | 4/2008 |
| JP | 2009502533 A | 1/2009 |
| JP | 2009512566 A | 3/2009 |
| JP | 4499698 B2 | 7/2010 |
| JP | 2010188487 A | 9/2010 |
| JP | 2011009737 A | 1/2011 |
| JP | 4757891 B2 | 8/2011 |
| JP | 2012160683 A | 8/2012 |
| JP | 2012253259 A | 12/2012 |
| KR | 20070077012 A | 7/2007 |
| TW | I222390 B | 10/2004 |
| WO | 0180296 A1 | 10/2001 |
| WO | 2012102180 A1 | 8/2012 |
| WO | 2012115020 A1 | 8/2012 |
| WO | 2012141111 A1 | 10/2012 |

OTHER PUBLICATIONS

Libo Zhou, et al., "Development and evaluation of CMG wheels made by electrophoretic deposition", Journal of the Japane Society Abrasive Technology (JSAT), 2006, vol. 50, No. 3, pp. 130-133 (6 pages).

Notice of Reasons for Revocation dated Dec. 25, 2017 issued by the Japanese Patent Office in Application No. 2013-026081 (U.S. Pat. No. 6,016,301)(Appeal No. 2017-700346).

Sigeru Watanabe., et al., "A Study on the polishing characteristic of new Bell-jar type CMP equipment(the 9th)", The Japan Society for Precision Engineering, 2005, pp. 339-340 (4 pages).

Tadatomo Suga: "Machines and Tools" 35, (2001) 6 pages total.

Takanori Kidoh et al., "The proceedings of the 21st Meting on SiC and Related Wide Bandgap Semiconductors" (5 pages total).

The Society of Powder Technology, Japan, "Powder Technology Series", vol. 2, Powder Generation, The Nikkan Kogyo Shimbun, Ltd., 2005, pp. 137-164 (31 pages).

Tomohisa Kato, "Technology for Polishing SiC Wafer", Development and the latest trends of the SiCpower devices, S&T Publishing Inc., 2012, pp. 275-283 (25 pages).

Japanese Standards Association, "Glossary of Technical Terms in Japanese Industrial Standards", Forth Edition, Jul. 15, 1998, pp. 9 to 12, 520, 533, 982 (11 pages total).

Written Opinion dated Dec. 25, 2017 issued by the Japanese Patent Office in Application No. 2013-026081 (U.S. Pat. No. 6016301) (Appeal No. 2017-700346).

Communication dated Aug. 12, 2016, from the State Intellectual Property Office of People's Republic of China in counterpart Application No. 201480008414.7.

Communication dated Aug. 30, 2016, from the Japanese Patent Office in counterpart application No. 2013-026081.

Communication dated Dec. 5, 2016, issued by the Korean Intellectual Property Office in corresponding Korean Application No. 10-2015-7024095.

Communication dated Jul. 10, 2017 from the Japanese Patent Office in counterpart application No. 2013-026081.

Communication dated Jun. 25, 2015 from the Taiwanese Intellectual Property Office in counterpart application No. 103104771.

Communication dated May 4, 2017, from the State Intellectual Property Office of the P.R.C., in counterpart Chinese application No. 201480008414.7.

Communication dated Jul. 10, 2017 from the Japanese Patent Office in counterpart application No. 2017-700346.

International Search Report dated Apr. 15, 2014 in counterpart International Application No. PCT/JP2014/053379.

Makoto Sato et al., "The Trial of Polishing of the Single-Crystal Silicon Carbide(SiC) by an Abrasive Grain Intension Polishing Pad", Annual Report of the Ceramics Research Laboratory Nagoya Institute of Technology, Ceramics Research Laboratory, Nagoya Institute of Technology, 2008, vol. 7, pp. 49-53 (9 pages).

Tadashi Oshita et al., "Mechanochemical Mirror Processing of Silicon Carbide Single Crystal Wafers", The Japan Society for Precision Engineering, 2006, pp. 551-552 (4 pages) Abstract at p. 2.

Masahiro Yamauchi et al., "Mechanochemical Polishing of SiC Wafers by TiO2 Abrasive", The Japan Society for Precision Engineering, 2005, pp. 823-824 (4 pages).

Makoto Sato et al., "Development of the polishing pad involving abrasive grains(5)", The Japan Society for Precision Engineering, 2007, pp. 219-220 (4 pages) Abstract at p. 2.

(56) References Cited

OTHER PUBLICATIONS

Makoto Sato et al., "Influence of the hydroxyl radical in single-crystal SiC polishing", The Japan Society for Precision Engineering, 2008, pp. 207-208 (4 pages) Abstract at p. 2.

Makoto Sato, "Enhancement in Efficiency of Process for Polishing SiC Single Crystal", Material Stage, Technical Information Institute Co., Ltd., Sep. 10, 2009, vol. 9, No. 6, pp. 50-53 (9 pages).

Makoto Sato et al., "Process for Processing Material of SiC Single-Crystal Substrate", Optical and Electro-Optical Engineering Contact, Japan Optomechatronics Association, Dec. 20, 2006, vol. 44, No., 12, pp. 47-54 (11 pages).

Masahiro Hasegawa et al.,"Surface Modification of Fine Inorganic Powder by Use of Mechanochemical Polymerization", Journal of Chemical Engineering of Japan, Society for Chemical Engineers, 1991, vol. 17, No. 5, pp. 1019-1025 (8 pages) Abstract at p. 7.

Restriction Requirement dated Mar. 9, 2016 in parent U.S. Appl. No. 14/765,875.

Non-Final Office Action dated Jul. 12, 2016 in parent U.S. Appl. No. 14/765,875.

Notice of Allowance and Fee(s) Due dated Dec. 7, 2016 in U.S. Appl. No. 14/765,875.

Notice of Allowance and Fee(s) Due dated Dec. 26, 2017 in parent U.S. Appl. No. 15/448,462.

Non-Final Office Action dated Jul. 27, 2017 in parent U.S. Appl. No. 15/448,462.

Lirong Guo et al.; "Mechanical Removal in CMP of Copper Using Alumina Abrasives"; Journal of the Electrochemical Society; vol. 151 (2); pp. G104-G108 (2004).

S. Noyel Victoria et al.; "Chemical Mechanical Planarization of Ruthenium with Oxone as Oxidizer"; Electrochemical and Solid-State Letters; vol. 15 (3); pp. H55-H58 (2012).

\* cited by examiner

SURFACE MACHINING METHOD FOR SINGLE CRYSTAL SIC SUBSTRATE, MANUFACTURING METHOD THEREOF, AND GRINDING PLATE FOR SURFACE MACHINING SINGLE CRYSTAL SIC SUBSTRATE

CROSS-REFERENCE TO RELATED APPLICATIONS

This application is a Divisional Application of U.S. application Ser. No. 15/448,462 filed Mar. 2, 2017 (issued as U.S. Pat. No. 9,960,048), which is a Divisional Application of U.S. application Ser. No. 14/765,875 filed Aug. 5, 2015 (issued as U.S. Pat. No. 9,620,374), which is a National Stage under § 371 of PCT/JP2014/053379 filed Feb. 13, 2014, which claims benefit from Japanese Patent Application No. 2013-026081 filed Feb. 13, 2013, the above-noted applications incorporated herein by reference in their entirety.

BACKGROUND OF THE INVENTION

Field of the Invention

The present invention relates to a surface machining method for a single crystal SiC substrate, a manufacturing method thereof, and a grinding plate for surface machining a single crystal SiC substrate.

Since silicon carbide (SiC) as a semiconductor material has a wider band gap than silicon (Si) currently used widely as a substrate for devices, studies are underway to produce power devices, high-frequency devices, high-temperature-operating devices, and the like using a single crystal SiC substrate.

A single crystal SiC substrate is formed by, for example, cutting a single crystal SiC ingot manufactured by using a sublimation method and then machining both surfaces to be mirror finished (for example, refer to PTL 1).

Since the cut substrate includes warped portions, undulating portions, or machining strain, the surfaces are polished to be mirror finished through chemical mechanical polishing (CMP) after the above-described defects are mitigated through, for example, grinding using diamond abrasive grains. However, since the machining speed of CMP is low, it is highly desirable that the depth of the machining strain layer be decreased as much as possible before CMP (for example, refer to NPL 1).

For the mirror-finish machining a non-oxide ceramic such as SiC, a mechano-chemical polishing technique is used. For example, NPL 2 discloses a method for dry polishing carried out on a polishing disc obtained by shaping chromium oxide abrasive grains having an average grain diameter of 0.5 μm with a resin such as acrylonitrile or phenol and results of the machining single crystal SiC.

CITATION LIST

Patent Literature

[PTL 1] Japanese Patent No. 4499698

Non-Patent Literature

[NPL 1] Takanori Kido, Kazutoshi Hotta, Kenji Kawata, Masatake Nagaya, Hiroto Maeda, Yoshihiro Deguchi, Syogo Matsuda, Atsunori Takeda, Ryuichi Takanabe, Tomohiro Nakayama, Tomohisa Kato: the proceedings of the 21st Meeting on SiC and Related Wide Bandgap Semiconductors, pp. 72 and 73

[NPL 2] Tadatomo Suga: Machines and Tools, 35, 92 to 96 (1991)

SUMMARY OF THE INVENTION

However, in the method disclosed in NPL 2, a machining load of 0.34 MPa, which is unrealistic in a mass-production step, is required for small single crystal specimens and thus it is not possible to apply this method to the practical use of a current SiC power semiconductor having a target diameter of 6 inches. Furthermore, the polishing disc disclosed in NPL 2 is a so-called resin bond grindstone with which it is not possible to avoid the generation of small scratches.

Therefore, in order to develop a mirror-finish machining method that can be used for the mass-production of single crystal SiC substrates having a mirror finish that can be used in current devices on the basis of the method disclosed in NTL 2, it is necessary to solve at least the problem of the machining load and the problem of the generation of small scratches.

In order to solve the above-described problems, the present inventors carried out intensive studies and realized the present invention after performing at least a plurality of steps described below.

NPL 2 discloses a mechanism of machining in which a mechano-chemical action is carried out in which the surface of the specimen is oxidized using chromium oxide as a catalyst and is removed using abrasive grains, whereby effective machining is achieved. The present inventors carried out in-depth studies regarding the mechano-chemical action and mechanism and came to the following conclusions. That is, energy is supplied due to mechanical rubbing between abrasive grains made of a material having a band-gap and a substance to be machined, and electrons on the surfaces of the abrasive grains are excited, thereby generating electron-hole pairs. Therefore, by the same mechanism as that for a photocatalyst material, active species having an extremely strong oxidation power such as a superoxide anion, a hydroxyl radical, or atomic oxygen are generated and the surface of the specimen is oxidized. In a case in which the substance to be machined is single crystal SiC, it is considered that the oxidation product is assumed to be $SiO_2 \cdot nH_2O$ and CO or $CO_2$, and $SiO_2 \cdot nH_2O$ is removed using abrasive grains, whereby the surfaces of a single crystal SiC substrate can be machined to a mirror finish. In the present specification, the above-described action will be defined as a tribo-catalytic action.

In the present invention, scratches on the surface of a single crystal SiC substrate, which are generated during grinding on the basis of a mechanical removal action in which diamond abrasive grains or the like are used, are reduced by using abrasive grains having the tribo-catalytic action.

In the tribo-catalytic action, it is important to efficiently supply mechanical energy to abrasive grains and generate a large number of electron-hole pairs. Since the majority of the electron-hole pairs do not contribute to the generation of active species but recombine with each other and disappear, it becomes necessary to increase the probability of the generation of the active species.

In the present invention, in order to easily apply the machining a single crystal SiC substrate having a large diameter to mass production, it is necessary that tribo-catalytic abrasive grains be used in a state of being mounted in a grinder. Since there have been no previous reports of carrying out machining in which tribo-catalytic action is used with a grinder, grinding conditions under which tribo-catalytic action can be effectively employed have recently been investigated. As a result, it was found that there are appropriate ranges for the kinds of abrasive grains, the selection of particle diameters, the kinds of coolants, the supply rates, the rotation speeds of grinding plates, and the like.

In addition, it was found that, in a case in which a so-called grindstone made by fixing abrasive grains with a bond material, which has been generally used as a grinding plate for grinders in the related art, is produced and used, the generation of small scratches is inevitable even in machining in which tribo-catalytic action is used.

Therefore, after intensive studies, the use of a pad for CMP, which has never been applied to grinders before, as the base substance of the grinding plate was considered.

In addition, there are a variety of materials having tribo-catalytic action and, for example, diamond, SiC, and the like are also materials having a bandgap and thus exhibit tribo-catalytic action. However, these materials are unsuitable since they are not as soft as single crystal SiC and thus scratches are generated on the machined surface of single crystal SiC.

Therefore, in the present invention, in order to reduce scratches generated on the machined surface of single crystal SiC during grinding, a substance softer than single crystal SiC is used as abrasives grains.

An object of the present invention is to provide a surface machining method for a single crystal SiC substrate which can be applied to a mass-production step using an existing grinder and is capable of suppressing the generation of small scratches, a manufacturing method thereof, and a grinding plate for surface machining a single crystal SiC substrate.

The present invention provides the following means:

(1) A surface machining method for a single crystal SiC substrate, comprising: a step of mounting a grinding plate which includes a soft pad and a hard pad sequentially attached onto a base metal having a flat surface, a step of generating an oxidation product by using the grinding plate, and a step of grinding the surface while removing the oxidation product, wherein abrasive grains made of at least one metallic oxide that is softer than single crystal SiC and has a bandgap are fixed to the surface of the hard pad.

(2) The surface machining method for a single crystal SiC substrate according to (1), in which pure water is used as a coolant.

(3) The surface machining method for a single crystal SiC substrate according to (1), in which a coolant is not used or the supply rate of pure water used as the coolant is greater than 0 ml/min and less than or equal to 100 ml/min.

(4) The surface machining method for a single crystal SiC substrate according to any one of (1) to (3), in which the rotation direction of a table for a substance to be machined is the inverse direction of the rotation direction of the grinding plate, the hard pad is segmented, and the rotation speed of the table for a substance to be machined is in a range of 30 rpm to 300 rpm.

(5) A manufacturing method for a single crystal SiC substrate, comprising: a step of mounting a grinding plate which includes a soft pad and a hard pad sequentially attached onto a base metal having a flat surface, a step of generating an oxidation product by using the grinding plate, and a step of grinding the surface while removing the oxidation product, wherein abrasive grains made of at least one metallic oxide that is softer than single crystal SiC and has a bandgap are fixed to the surface of the hard pad.

(6) A grinding plate for surface machining a single crystal SiC substrate including a soft pad and a hard pad sequentially attached onto a base metal having a flat surface, abrasive grains made of at least one metallic oxide that is softer than single crystal SiC and has a bandgap are fixed to the surface of the hard pad.

(7) The grinding plate for surface machining a single crystal SiC substrate according to (6), in which the metal oxide is one or more selected from cerium oxide, titanium oxide, silicon oxide, aluminum oxide, iron oxide, zirconium oxide, zinc oxide, and tin oxide.

(8) The grinding plate for surface machining a single crystal SiC substrate according to (7), in which the metal oxide includes at least cerium oxide.

(9) The grinding plate for surface machining a single crystal SiC substrate according to any one of (6) to (8), in which the specific surface area of the abrasive grains is in a range of 0.1 m2/g to 300 m2/g.

(10) The grinding plate for surface machining a single crystal SiC substrate according to any one of (6) to (9), in which the soft pad is a non-woven fabric or suede-based pad.

(11) The grinding plate for surface machining a single crystal SiC substrate according to any one of (6) to (10), in which the hard pad is a foamed polyurethane-based pad.

(12) The grinding plate for surface machining a single crystal SiC substrate according to any one of (6) to (11), in which the abrasive grains are fixed by using a binding agent and/or an adhesive.

(13) The grinding plate for surface machining a single crystal SiC substrate according to any one of (6) to (12), in which the abrasive grains are fixed by attaching an abrasive grain-fixed film to the hard pad.

In the present specification, the term "single crystal SiC substrate" will be commonly used as the substrate before surface grinding, the substrate during surface grinding, and the substrate after surface grinding.

According to the present invention, it is possible to provide a surface machining method for a single crystal SiC substrate which can be applied to a mass-production step using an existing grinder, is capable of suppressing the generation of small scratches, and is capable of rapidly producing a mirror-finish, a manufacturing method thereof, and a grinding plate for surface machining a single crystal SiC substrate.

DETAILED DESCRIPTION OF THE INVENTION

Figure 1B:
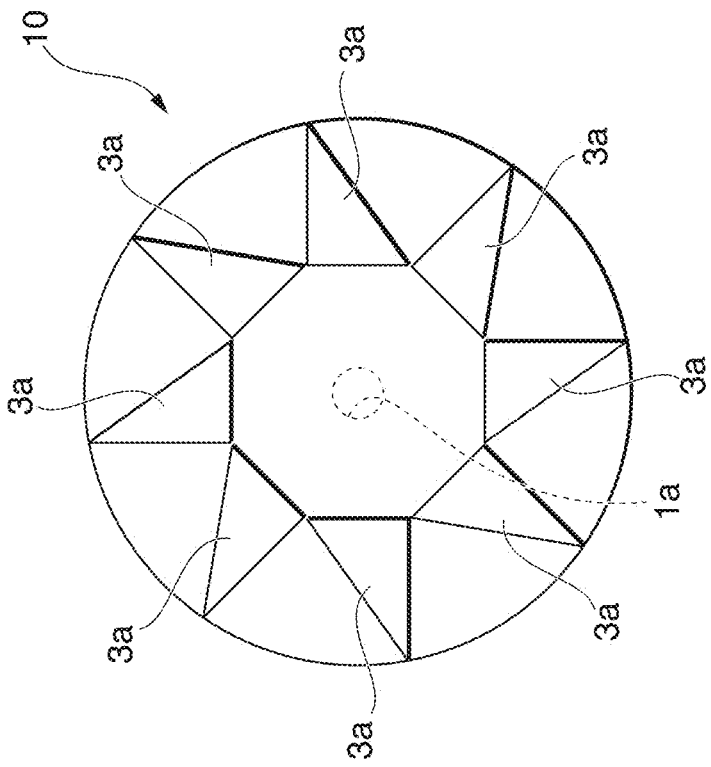
FIGS. 1A and 1B are a schematic view illustrating the structure of a grinding plate of the present invention.

Hereinafter, for a surface machining method for a single crystal SiC substrate, a manufacturing method thereof, and a grinding plate for surface machining a single crystal SiC substrate to which the present invention is applied, the configurations thereof will be described using drawings. In the drawings, there are cases in which the characteristic portions are enlarged for the better understanding of the characteristics and the dimensional ratios and the like of the respective constituent components are not always identical to the actual dimensional ratios and the like thereof. In addition, materials, dimensions, and the like exemplified in the following description are simple examples and the present invention is not limited thereto and can be carried out in an appropriately modified manner within the scope of the gist of the present invention.

Grinding Plate for Surface Machining a Single Crystal SiC Substrate

Figure 1A:
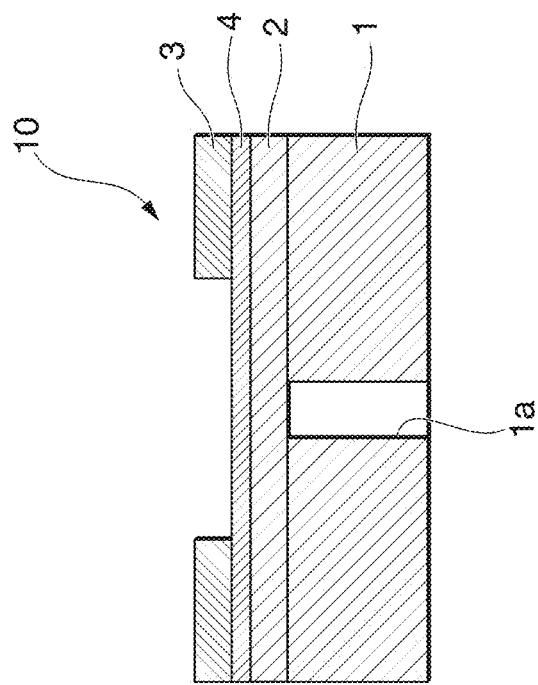

FIGS. 1A and 1B contain schematic views illustrating an example of a grinding plate for surface machining a single crystal SiC substrate according to an embodiment of the present invention. FIG. 1A is a sectional view and FIG. 1B is a plan view.

A grinding plate 10 illustrated in FIGS. 1A and 1B includes a base metal 1 having a flat surface and a soft pad 2 and a hard pad 3 sequentially attached onto the base metal 1. Abrasive grains (not illustrated) made of at least one metallic oxide that is softer than single crystal SiC and has a bandgap are fixed to the surface of the hard pad 3.

In this example, the soft pad 2 and the hard pad 3 are attached to each other through an adhesive sheet 4 and the hard pad 3 is made up of eight sheets (3a) that are segmented in a right-angled triangular shape. In addition, the base metal 1 includes a screw hole 1a for fixing the grinding plate to a grinder. In this case, the adhesive sheet 4 is used to prevent water absorption of the soft pad when a coolant such as pure water or the like is used and to stabilize the attachment of the hard pad. However, the hard pad 3 and the soft pad 2 may be directly attached to each other without using the adhesive sheet.

In addition, as illustrated in this example, the soft pad 2 and the adhesive sheet 4 need not have a hole at a portion corresponding to the screw hole 1a for the purpose of covering the screw hole 1a with a lid to prevent the intrusion of chips or the coolant.

When mechanically rubbed with a substance to be machined during surface grinding of the single crystal SiC substrate, the abrasive grains having a bandgap supply energy, thus, electrons on the surfaces of the abrasive grains are excited, and then electron-hole pairs are generated, active species having an extremely strong oxidation power such as a superoxide anion, a hydroxyl radical, or atomic oxygen and the surface of the specimen is oxidized. In addition, $SiO_2 \cdot nH_2O$ generated due to the oxidization of the surface of the specimen is removed using abrasive grains, whereby the surfaces of the single crystal SiC substrate can be machined. That is, a tribo-catalytic action is exhibited.

As a material having a bandgap which exhibits a tribo-catalytic action, particularly, metallic oxides are all materials softer than the single crystal SiC. In addition, since almost all metallic oxides are materials having a bandgap, and powder having tribo-catalytic action can be industrially produced and used in abrasive grains, pigments, photocatalysts, and the like, metallic oxides can be preferably used.

The powder of at least one metallic oxide selected from cerium oxide, titanium oxide, silicon oxide, aluminum oxide, iron oxide, zirconium oxide, zinc oxide, and tin oxide is preferable since the metallic oxide can be easily produced industrially and is a material having a bandgap and thus has a tribo-catalytic action.

Cerium oxide is the metallic oxide, the powder of which can be most preferably used, in consideration of the fact that cerium oxide can be, industrially, easily procured and is a semiconductor material having a bandgap and thus exhibits the tribo-catalytic action.

Since the abrasive grains need to have the capability to remove $SiO_2 \cdot nH_2O$, they need to have a specific particle diameter. However, when the primary particle diameter is large, the specific surface area becomes small and, similar to a photocatalytic action, the tribo-catalytic action cannot be efficiently exhibited, and thus there is an appropriate range therefor. That is, in terms of the mechanical removal capability of the abrasive grains, a large grain diameter, that is, a small specific surface area is advantageous. Meanwhile, similar to an ordinary catalytic action, the tribo-catalytic action is affected by the surface and thus a large specific surface area leads to a strong effect. Therefore, a range in which both the grain diameter and the specific surface area are well-balanced becomes the above-described appropriate range.

The specific surface area of the abrasive grains is preferably in a range of 0.1 $m^2/g$ to 300 $m^2/g$. This is because, when the specific surface area is smaller than 0.1 $m^2/g$, there is a concern that the tribo-catalytic action cannot be efficiently exhibited and, when the specific surface area is larger than 300 $m^2/g$, there is a concern that $SiO_2 \cdot nH_2O$ cannot be efficiently removed.

The specific surface area of the abrasive grains is more preferably in a range of 0.5 $m^2/g$ to 200 $m^2/g$. This is because, when the specific surface area is set to 0.5 $m^2/g$ or more, the tribo-catalytic action can be more efficiently exhibited and, when the specific surface area is set to 200 $m^2/g$ or less, $SiO_2 \cdot nH_2O$ can be more efficiently removed.

The specific surface area of the abrasive grains is still more preferably in a range of 1 $m^2/g$ to 100 $m^2/g$. This is because, when the specific surface area is set to 1 $m^2/g$ or more, the tribo-catalytic action can be still more efficiently exhibited and, when the specific surface area is set to 100 $m^2/g$ or less, $SiO_2 \cdot nH_2O$ can be still more efficiently removed.

Since the grinding plate includes the base metal, the grinding plate can be mounted in a grinder in order to be used in the grinder.

As the base metal, a well-known base metal can be used and examples thereof include base metals the material of which is an aluminum alloy such as silumin.

The base metal has a flat surface facing a substance to be machined and the grinding plate has a structure in which the soft pad and the hard pad are sequentially attached onto the flat surface thereof. When the above-described structure is provided, the machining of the surface standard, that is, the machining uniformly flattening the surface of a substance to be machined on the basis of the surface to be machined of the substance to be machined as the standard surface, is possible and it is possible to suppress scratches generated on the surface of the single crystal SiC substrate, which is the substance to be machined, to the minimum extent.

As the soft pad, it is possible to use a non-woven fabric or suede-based pad.

As the hard pad, it is possible to use a foamed polyurethane-based pad.

On the outermost surface of the grinding plate which is subjected to machining, the abrasive grains made of at least one metallic oxide that is softer than single crystal SiC and has a bandgap is fixed to the surface of the hard pad. These abrasive grains can be fixed to the surface of the hard pad using a binding agent or an adhesive.

In addition, the abrasive grains can be fixed by attaching a commercially available abrasive grain-fixed film to the hard pad.

The Surface Machining Method for the Single Crystal SiC Substrate

In a surface machining method for a single crystal SiC substrate according to an embodiment of the present invention, a grinding plate including a soft pad and a hard pad sequentially attached onto a base metal having a flat surface, in which abrasive grains made of at least one metallic oxide that is softer than single crystal SiC and has a bandgap is fixed to the surface of the hard pad, is mounted in a grinder, an oxidation product is generated by using the grinding plate, and the surface is ground while removing the oxidation product.

As the grinder in which the grinding plate is mounted, a well-known grinder can be used.

Figure 2:
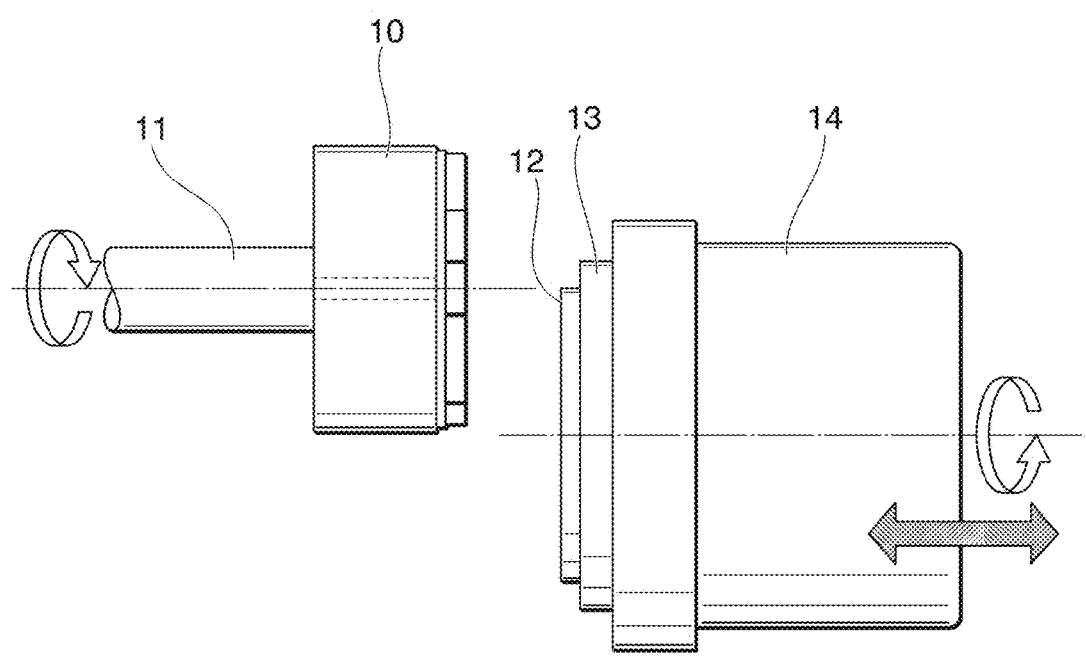
FIG. 2 is a schematic view illustrating a part of the structure of an example of a surface grinder in which the grinding plate of the present invention is used.

FIG. 2 is a schematic view illustrating the structure of a part that grinds the single crystal substrate of an example of the grinder in which the grinding plate of the present invention is mounted. The grinding plate 10 illustrated in FIGS. 1A and 1B is mounted in a driving unit 11 and the driving unit is rotated using a motor belt. A single crystal SiC substrate 12 is fixed to a table for a substance to be machined 13 through vacuum adsorption using a vacuum chucking device (not illustrated). A substrate-holding section 14 is sent in a grinding plate direction while being rotated together with the table for a substance to be machined 13, whereby the substrate is ground.

When the grinding conditions are appropriately selected, the tribo-catalytic action of the grinding plate with respect to single crystal SiC is significantly exhibited and thus an oxidation product can be generated.

The rotation speed of the grinding plate is preferably in a range of 300 rpm to 3000 rpm. This is because, when the rotation speed is lower than 300 rpm, the mechanical energy supplied to the abrasive grains is too small and there is a concern that the tribo-catalytic action may not be exhibited and, when the rotation speed is higher than 3000 rpm, there is a concern that a problem of heat generation or the vibration of the device may become unignorable. Since there has been no experience of applying a grinding plate having the tribo-catalytic action to a grinder, it has not been clear whether or not the tribo-catalytic action is exhibited in the existing specification of the grinder. As a result of intensive studies, it has been clarified that an ordinary rotation speed of the grinding plate can be applied.

The rotation speed of the grinding plate is more preferably in a range of 500 rpm to 2000 rpm. This is because, when the rotation speed is set to 500 rpm or higher, it becomes possible to generate more sufficient mechanical energy for the tribo-catalytic action and, when the rotation speed is set to 2000 rpm or lower, it becomes possible to more reliably avoid the problem of heat generation or the vibration of the device.

The rotation direction of the table for a substance to be machined can be set in the forward direction (the same direction) of the rotation direction of the grinding plate. In this case, the rotation speed of the table for a substance to be machined is preferably in a range of 80% to 120% of the rotation speed of the grinding plate. This is because, when the rotation speed of the table for a substance to be machined is set to lower than 80% or higher than 120% of the rotation speed of the grinding plate, the amount of the machined surface removed becomes uneven.

The rotation direction of the table for a substance to be machined can be set in the inverse direction of the rotation direction of the grinding plate. In this case, in order to uniform the amount of the machined surface removed, the rotation speed of the table for a substance to be machined is preferably in a range of 30 rpm to 300 rpm under the condition that the hard pad is segmented into an appropriate shape.

The reasons therefore are as described below.

When the hard pad is segmented, that is, the hard pad is divided and attached in an appropriate size, it is possible to control the contact frequency between the abrasive grains on the grinding plate, which rotates in the inverse direction to the substance to be machined, and the surface to be machined of the substance to be machined and, for example, it is possible to prevent uneven machining in which only the central portion of the substance to be machined is ground to a great extent. In an ordinary grinder, the table for a substance to be machined is disposed so that the rotation center of the table for a substance to be machined lies on an outer circumferential portion of the grinding plate and the rotation direction of the table for a substance to be machined is the inverse direction of the rotation direction of the grinding plate. Therefore, when the abrasive grains are present throughout the entire surface of the grinding plate, the contact frequency of the abrasive grains to the central portion of the substance to be machined increases and only the central portion is ground. Appropriate segmentation for preventing the above-described phenomenon is effective.

In addition, when the rotation speed of the table for a substance to be machined is set to lower than 30 rpm or higher than 300 rpm, the grinder operates outside the ordinary specification and there is a concern that the amount of the machined surface removed becomes uneven.

In a case in which a coolant is used, pure water is preferably used. This is because, when there is an impurity component, there is a concern that the tribo-catalytic action may not be exhibited. For the tribo-catalytic action, it is important to make the mechanical energy efficiently contribute to the generation of electron-hole pairs. However, there is a concern that the interposition of impurities itself may hinder the efficient contribution of the mechanical energy, in addition, the enhancement of the lubrication action of water decreases the friction resistance and, consequently, there is a concern that the mechanical energy supplied to the abrasive grains may decrease. In addition, there is another concern that the interposition of impurities may hinder a process in which the abrasive grains efficiently remove the oxidation product.

The coolant may not be used and, when pure water is used as the coolant, the supply rate of pure water is preferably 100 ml/min or lower. This is because, when the supply rate thereof is higher than 100 ml/min, the energy supplied to the abrasive grains due to mechanical rubbing becomes too small and there is a concern that the tribo-catalytic action may not be sufficiently exhibited. In addition, this is because, when the supply rate of pure water is too high, the action of pure water as a lubricant becomes strong and the friction resistance decreases. As a result, the energy supplied to the abrasive grains becomes small and there is another concern that only an insufficient number of electron-hole pairs may be generated.

The Method for Manufacturing the Single Crystal SiC Substrate

A method for manufacturing a single crystal SiC substrate according to an embodiment of the present invention includes a step of mounting a grinding plate which includes a soft pad and a hard pad sequentially attached onto a base metal having a flat surface, a step of generating an oxidation product by using the grinding plate, and a step of grinding the surface while removing the oxidation product, wherein abrasive grains made of at least one metallic oxide, that is softer than single crystal SiC and has a bandgap, are fixed to the surface of the hard pad. In the method for the present invention, since the oxidation on the surface of SiC is used, the method has a relationship with the height of the oxidation barrier and can be preferably applied to a C plane of a (0001) plane of the SiC substrate.

EXAMPLES

Hereinafter, the present invention will be more specifically described by using examples, but the present invention is not limited to the following examples.

First Example

The surface of an aluminum alloy base metal having a M12 screw hole and an outer diameter of 150 mm, which was prepared so as to be capable of being mounted on a grinder MHG-2000 manufactured by Shuwa Industry Co., Ltd., which faced a substance to be machined, was machined to be flat and a pad for CMP SUBA600 (soft pad) manufactured by Nitta Haas Incorporated was attached onto the above-described surface. Next, eight pads for CMP IC1000 (hard pads) manufactured by Nitta Haas Incorporated, which were segmented into a 30 mm×40 mm×50 mm right-angled triangular shape, were attached onto the SUBA600 through an FEP adhesive sheet film manufactured by AS ONE Corporation, thereby producing a grinding plate base body. Truing was carried out on the grinding plate base body using a conditioner CMP-M100A manufactured by Asahi Diamond Industrial Co., Ltd. Finally, TRIZACT film (cerium oxide) manufactured by 3M, which was segmented into a 30 mm×40 mm×50 mm right-angled triangular shape, was attached onto the surface of the trued IC1000 segment, thereby producing a grinding plate for surface machining single crystal SiC substrates having the tribo-catalytic action.

Next, the produced grinding plate was mounted in a grinder MHG-2000. An n-type (000-1) 4H—SiC (4° off) single crystal ingot (C plane) (single crystal SiC substrate) having a diameter of three inches manufactured by Tankeblue Semiconductor Co., Ltd., which was previously ground to be flat using a vitrified bond diamond wheel (#4000) manufactured by Asahi Diamond Industrial Co., Ltd., was fixed to a table for a substance to be machined using a vacuum chucking device, and the surface on the C plane side was machined.

The rotation direction of the table for a substance to be machined was set in the inverse direction of the rotation direction of the grinding plate, the rotation speed of the table for a substance to be machined was set, and the surface was machined at a supply rate of pure water of 0 ml/min, that is, in a dry mode. The table for a substance to be machined was manually sent slowly and the current value of a motor for the rotation of the grindstone was set in a range of 2.4 A to 2.8 A. The machining time was three minutes.

Regarding the amount of the single crystal ingot removed, as a result of measuring the heights of the ingot before and after the machining at nine points in the surface using a height meter manufactured by Mitutoyo Corporation and computing the amounts, the average value was 3.8 μm. The machining speed had a high value of 1.3 μm/min. The difference between the maximum value and the minimum value of the height of the ingot after the machining was 1.4 μm and the surface was uniformly machined.

Figure 3:
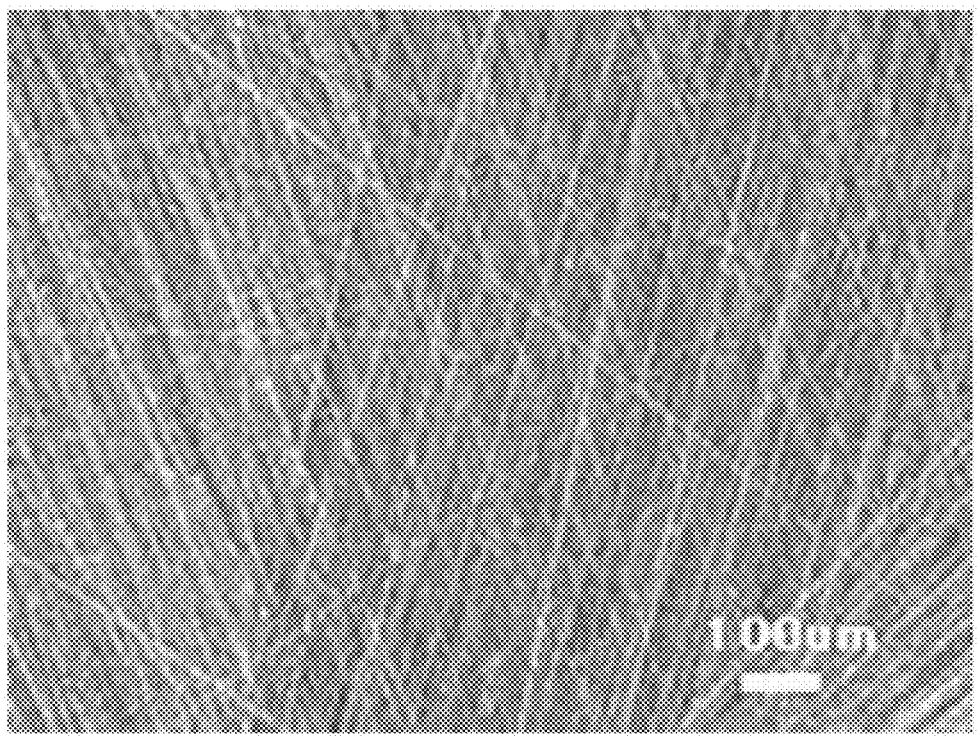
FIG. 3 is an optical photomicrograph of a surface of a single crystal SiC ingot before machining in a first example of the present invention.
Figure 4:
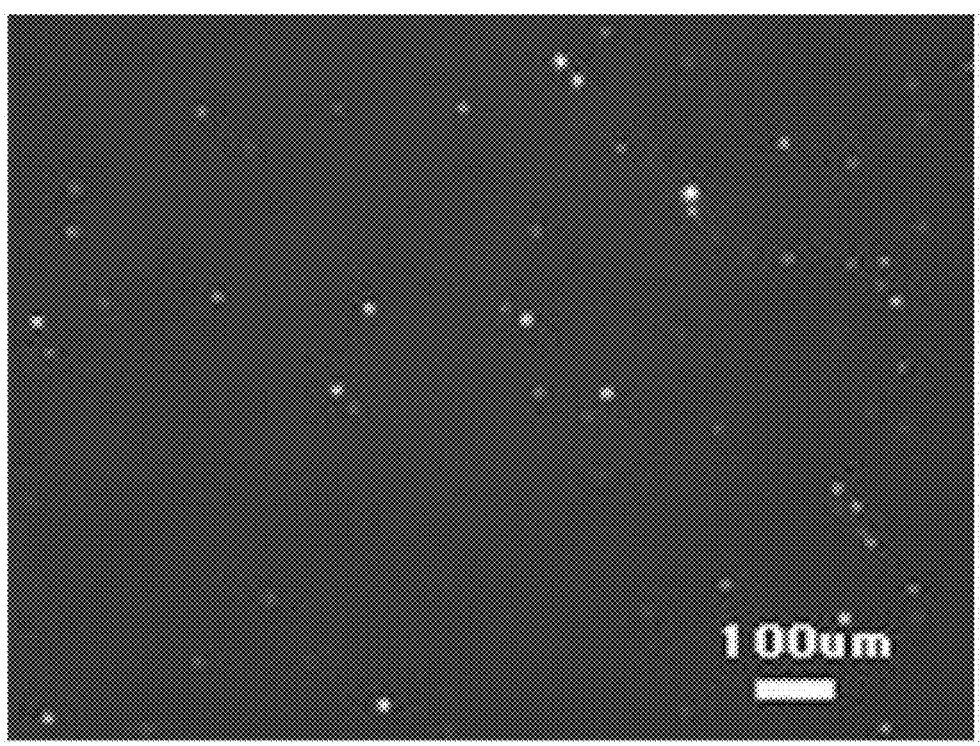
FIG. 4 is an optical photomicrograph of the surface of the single crystal SiC ingot after the machining in the first example of the present invention.

The results of the dark-field observation of the surface of the ingot before and after machining carried out by using an optical microscope manufactured by Olympus Corporation are illustrated in FIGS. 3 and 4.

Numerous scratches due to grinding generated by the #4000 diamond abrasive grains observed in the ingot before machining completely disappeared. Only bright points caused by crystal defects or fine foreign substances were observed, and a mirror finish with no machining strain was achieved.

Second Example

The grinding plate for surface machining single crystal SiC produced in the first example was used and the machining was carried out under the same grinding conditions as in the first example except for the fact that the amounts of pure water supplied were set to 10 ml/min, 50 ml/min, and 100 ml/min.

The machining rates were 1.0 μm/min, 0.6 μm/min, and 0.2 μm/min respectively and, similar to the case of the first example, it was confirmed that grinding scratches completely disappeared in the dark-field observation by using an optical microscope.

Comparative Example 1

The grinding plate for surface machining single crystal SiC produced in the first example was used and the machining was carried out under the same grinding conditions as in the first example except for the fact that the amount of pure water supplied was set to 150 ml/min. As a result, it was confirmed that the machining rate was almost zero and grinding scratches rarely disappeared in the dark-field observation using an optical microscope. It is considered that, at the amount of pure water supplied of 150 ml/min, the energy supplied to the abrasive grains by the mechanical rubbing was too small and the tribo-catalytic action was not exhibited.

Comparative Example 2

As a result of using a resin-bonded cerium oxide grindstone manufactured by Nihon Grinding Wheel Co., Ltd. as a grinding plate and carrying out the same machining as in the first example, the average value of the machining rates was 0.7 μm/min. However, the grinding was not uniformly carried out so that the central portion of the ingot was ground to a great extent and small scratches were observed in the dark-field observation using an optical microscope. It is considered that, unlike the present invention, the grinding plate did not have a configuration of the combination of the soft pad and the hard pad and thus machining on the basis of the surface standard was not possible and, furthermore, it was not possible to suppress the generation of small scratches.

Industrial Applicability

The surface machining method for a single crystal SiC substrate, the manufacturing method thereof, and the grinding plate for surface machining a single crystal SiC substrate of the present invention can be used for the production of single crystal SiC substrates and can be used in a step of machining a substrate to be thin by grinding the back surface of the substrate after device fabrication.

REFERENCE SIGNS LIST

1 BASE METAL
2 SOFT PAD
3 HARD PAD
10 GRINDING PLATE FOR SURFACE MACHINING SINGLE CRYSTAL SiC SUBSTRATE

The invention claimed is:

1. A surface machining method for a single crystal SiC substrate, comprising:
   a step of mounting a grinding plate which includes a first pad and a second pad harder than the first pad sequentially attached onto a base metal having a mounting surface in a grinder,
   a step of generating an oxidation product by using the grinding plate, and
   a step of grinding the surface while removing the oxidation product,
   wherein abrasive grains made of at least one metallic oxide that is softer than single crystal SiC and has a bandgap are fixed to the surface of the second pad;
   the grinder has a table for a substance to be machined for fixing a driving unit for rotatably mounting the grinding plate and a single crystal SiC substrate; and
   the step of grinding the surface is carried out by rotating the grinding plate at a rotational speed of 500 rpm to 3000 rpm.

2. The surface machining method for a single crystal SiC substrate according to claim 1,
   wherein pure water is used as a coolant.

3. The surface machining method for a single crystal SiC substrate according to claim 1,
   wherein a coolant is not used or the supply rate of pure water used as the coolant is greater than 0 ml/min and less than or equal to 100 ml/min.

4. The surface machining method for a single crystal SiC substrate according to claim 1,
   wherein the metal oxide is one or more selected from cerium oxide, titanium oxide, silicon oxide, aluminum oxide, iron oxide, zirconium oxide, zinc oxide, and tin oxide.

5. The surface machining method for a single crystal SiC substrate according to claim 1,
   wherein the metal oxide includes at least cerium oxide.

6. The surface machining method for a single crystal SiC substrate according to claim 1,
   wherein the abrasive grains are fixed by using a binding agent and/or an adhesive.

7. The surface machining method for a single crystal SiC substrate according to claim 1,
   wherein the abrasive grains are fixed by attaching an abrasive grain-fixed film to the second pad.

8. A method for producing a single crystal SiC substrate, comprising:
   a step of mounting a grinding plate which includes first pad and second pad harder than the first pad sequentially attached onto a base metal having mounting surface in a grinder,
   a step of generating an oxidation product by using the grinding plate, and
   a step of grinding the surface while removing the oxidation product,
   wherein abrasive grains made of at least one metallic oxide that is softer than single crystal SiC and has a bandgap are fixed to the surface of the second pad,
   the grinder has a table for a substance to be machined for fixing a driving unit for rotatably mounting the grinding plate and a single crystal SiC substrate; and
   the step of grinding the surface is carried out by rotating the grinding plate at a rotational speed of 500 rpm to 3000 rpm.

* * * * *